(12) United States Patent
Tanamoto et al.

(10) Patent No.: US 7,001,787 B2
(45) Date of Patent: Feb. 21, 2006

(54) ELECTRODE MANUFACTURING METHOD

(75) Inventors: Tetsufumi Tanamoto, Kanagawa-Ken (JP); Satoshi Saito, Kanagawa-Ken (JP); Shinobu Fujita, Kanagawa-Ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/902,301

(22) Filed: Jul. 30, 2004

(65) Prior Publication Data

US 2005/0026411 A1    Feb. 3, 2005

(30) Foreign Application Priority Data

Aug. 1, 2003    (JP)    ............... 2003-285347

(51) Int. Cl.
*H01L 21/00* (2006.01)
(52) U.S. Cl. ............. 438/20; 438/478; 438/500; 438/502; 438/503; 438/507; 438/509; 428/328; 428/331; 106/286.1; 106/286.2; 106/286.4
(58) Field of Classification Search .......... None
See application file for complete search history.

(56) References Cited

U.S. PATENT DOCUMENTS

| | | | | |
|---|---|---|---|---|
| 5,204,191 A | * | 4/1993 | Dubois et al. ............ | 428/650 |
| 5,420,845 A | * | 5/1995 | Maeda et al. ............ | 369/100 |
| 5,710,069 A | * | 1/1998 | Farkas et al. ............ | 438/7 |
| 5,731,598 A | * | 3/1998 | Kado et al. ............ | 257/30 |
| 5,889,756 A | * | 3/1999 | Ichihara et al. ............ | 369/275.2 |
| 6,091,078 A | * | 7/2000 | Codama .................. | 257/40 |
| 6,686,125 B1 | * | 2/2004 | Hoshi et al. ............ | 430/271.1 |
| 2003/0013215 A1 | * | 1/2003 | Komoda et al. ............ | 438/20 |
| 2003/0082367 A1 | * | 5/2003 | Talpaert et al. ............ | 428/328 |

FOREIGN PATENT DOCUMENTS

| | | | |
|---|---|---|---|
| FR | WO 97/10185 | * | 3/1997 |
| FR | WO 98/23549 | * | 6/1998 |
| JP | 7-226522 A | | 8/1995 |
| JP | 2001-7315 A | | 1/2001 |
| JP | 2002-100687 A | | 4/2002 |
| JP | 2002-279616 A | | 9/2002 |

OTHER PUBLICATIONS

T. Tanamoto, "Quantum Gates by Coupled Asymmetric Quantum Dots and Controlled-NOT-Gate Operation", Physical Review A, vol. 61 022305, Jan. 12, 2000, pp. 022305-1 to 022305-7.

A.J. Parker, "Design and Fabrication of Colloid-based Vertical Nanoscale Devices", Microelectronic Engineering, 61-62, (2002), pp. 681-686.

* cited by examiner

*Primary Examiner*—David Zarneke
*Assistant Examiner*—Victor V. Yevsikov
(74) *Attorney, Agent, or Firm*—Foley & Lardner LLP

(57) ABSTRACT

An electrode manufacturing method comprises: forming plural protruding portions on a surface of a substrate; introducing first particles having a size that changes according to heat, light, or a first solvent between said plural protruding portions; changing the size of the first particles by applying heat, light, or the first solvent to said first particles; and depositing an electrode material onto the surface of said substrate.

11 Claims, 16 Drawing Sheets

ELECTRODE MANUFACTURING METHOD

CROSS-REFERENCE TO RELATED APPLICATION

This application is based upon and claims the benefit of priority from the prior Japanese Patent Application No. 2003-285347, filed on Aug. 1, 2003, the entire contents of which are incorporated herein by reference.

BACKGROUND OF THE INVENTION

1. Field of the Invention

The present invention relates to an electrode manufacturing method.

2. Related Background Art

Recently, a technology for manufacturing a microstructure equal to or less than several tens of nanometers such as a carbon nanotube and a quantum dot on a semiconductor substrate has been developed. For example, B. Q. Wei et al., Nature, Vol. 416, P495 (2002) (hereinafter, referred to as "Non-patent document 1") discloses a technology for arraying carbon nanotubes on silicon oxide. Ago et al., Appl. Phys. Lett. Vol. 77, P79 (2000) (hereinafter, referred to as "Non-patent document 2") discloses a technology for manufacturing a carbon nanotube using the CVD method. The carbon tubes disclosed in these documents are, for example, applied to a transistor as disclosed in R. Martel et al., Appl. Phys. Lett. Vol. 73, P2447 (1998) (hereinafter, referred to as "Non-patent document 3"), or used for a field emitter used for an FED (Field Emission Display) disclosed in the non-patent document 2.

G. Springholtz et al., Phys. Rev. Lett. Vol. 84, P4669 (2000) (hereinafter, referred to as "Non-patent document 4") discloses a method for aligning quantum dots in a self-alignment manner. Further, T. Tanamoto, Physical Review A, Vol. 61, pp022305 (2000) (hereinafter, referred to as "Non-patent document 5") discloses a quantum bit (qubit) formed by combining two quantum dots of silicon. These quantum dots are used for a single electron element or a quantum computer. The quantum dot is disclosed in Z. h. Yuan et al., Appl. Phys. Lett. Vol. 78, P3127 (2001) (hereinafter, referred to as "Non-patent document 6").

Generally, in order to provide electrodes with respect to each microstructure less than several tens of nanometers, the electrodes should be positioned with an accuracy less than several nanometers. However, in a conventional lithography technology, it has been impossible to form electrodes in such microstructures with an accuracy less than several nanometers. This is because the wavelength of light in the conventional lithography technology is on the order of micrometers.

For example, it has been impossible to form gate electrodes and drain electrodes with respect to each carbon nanotube arranged in a matrix array at intervals less than several tens of nanometers. Further, in the non-patent document 3, a transistor using a carbon nanotube is disclosed, however, by the technology disclosed in the document, source electrodes and drain electrodes can not be formed with respect to each carbon nanotube. This is a disadvantage in light of high integration of the transistor.

Conventionally, in the case of using the carbon nanotube as a field emitter, gate electrodes can not be formed with respect to each carbon nanotube. Accordingly, by making several tens of carbon nanotubes into a bundle, gate electrodes are formed to the bundles. This is a disadvantage in high integration of the field emitter and miniaturization of the FED.

In a single electron element using quantum dots, for effective action of single electron effect at room temperature, a capacitance between quantum dots is required to be made as small as $10^{-18}$ farad. Further, in order to make the single electron element using quantum dots more advantageous than an LSI using a conventional MOS, electrodes are required to be provided with respect to each quantum dot. Further, in the quantum computer disclosed in the non-parent document 5, coherence of wave functions of electrons is important. On this account, the sizes of quantum dots and electrodes are required to be less than several nanometers. However, conventionally, it has been impossible to provide electrodes to such quantum dots, respectively.

SUMMARY OF THE INVENTION

An advantage of an aspect of the present invention is to provide an electrode manufacturing method for enabling formation of an electrode to a microstructure such as a carbon nanotube or quantum dot in a self-alignment manner in order to solve the above described problems.

An electrode manufacturing method according to an embodiment of the invention comprises: forming plural protruding portions on a surface of a substrate; introducing first particles having a size that changes according to heat, light, or a first solvent between said plural protruding portions; changing the size of the first particles by applying heat, light, or the first solvent to said first particles; and depositing an electrode material onto the surface of said substrate.

DETAILED DESCRIPTION OF THE INVENTION

Figure 1:
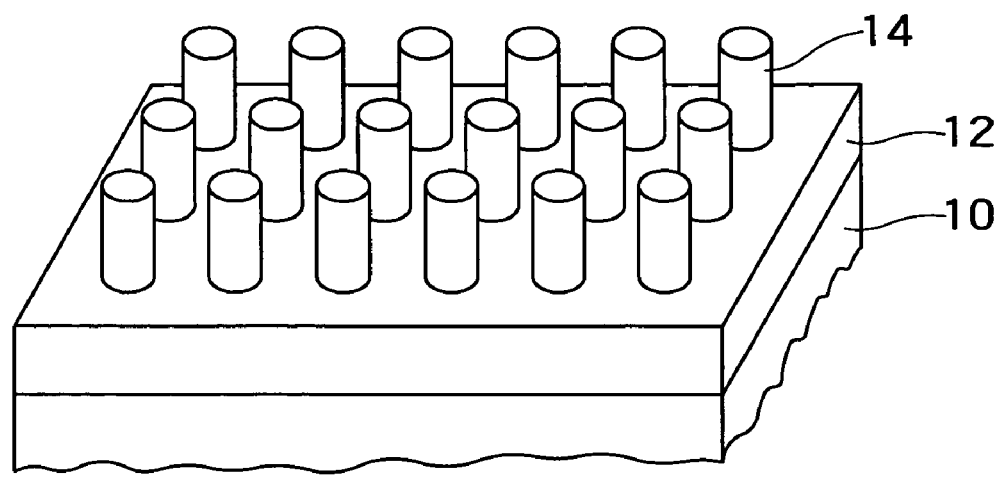
FIG. 1 shows a process of forming an electrode according to a first embodiment of the invention.

Hereinafter, referring to the drawings, embodiments according to the invention will be described. These embodiments are not for limiting the invention.

In electrode manufacturing methods according to the embodiments of the invention, fine particles are arranged between or on protruding portions such as carbon nanotubes and quantum dots. Then, the size of the fine particles is changed using a solvent and the like, and further, an electronic material is vapor-deposited on the protruding portions and fine particles. Then, the electrode material on the fine particles are eliminated by dissolving the fine particles. Thus, using the fine particles as a mask, electrode wiring can be formed on or around the minute nano level protruding portions of such as carbon nanotubes and quantum dots.

Figure 2:
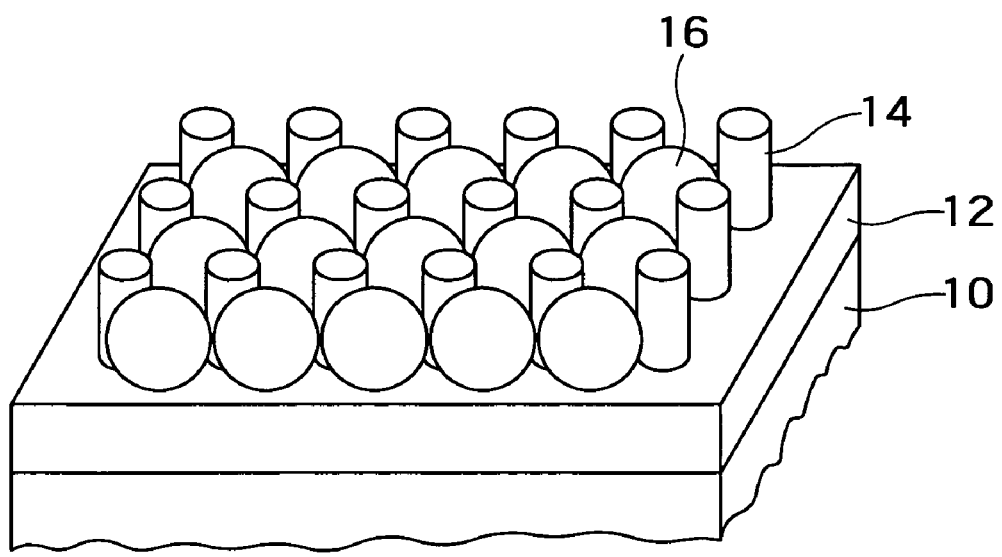
FIG. 2 shows a process subsequent to FIG. 1.
Figure 3:
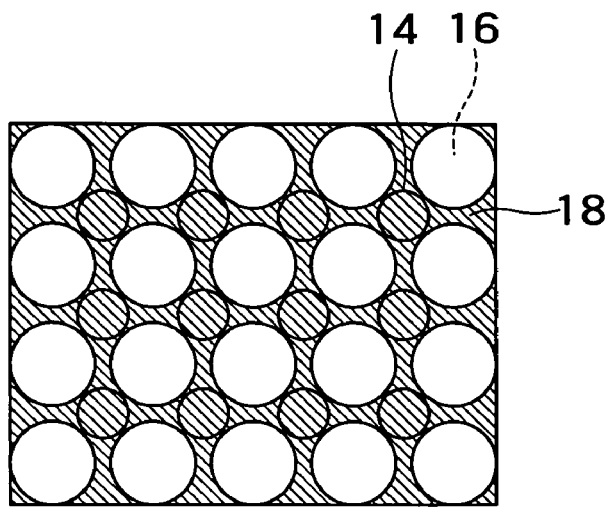
FIG. 3 shows a process subsequent to FIG. 2.

FIGS. 1 to 3 show processes of forming an electrode according to the first embodiment of the invention in the order of the processes. FIGS. 1 and 2 show the structure on a silicon substrate 10 in perspective views. FIG. 3 shows the structure on the silicon substrate 10 in a plan view.

As shown in FIG. 1, a silicon oxide film 12 is formed on the silicon substrate 10. The silicon substrate 10 may be a glass substrate. Carbon nanotubes 14 are arranged in a matrix form on the silicon oxide film 12. The carbon nanotubes 14 are formed in a height of about 20 $\mu$m on the surface of the silicon substrate 10 by the CVD method, for example. In order to arrange the carbon nanotubes 14 in such form on the silicon oxide film 12, for example, the technology disclosed in the non-patent document 1 may be used.

Next, a silicon oxide film (not shown) is formed on the surface of the carbon nanotubes 14 by the CVD method or the like. Then, a resist is applied onto the silicon oxide film (not shown). By etching back the resist, the silicon oxide film on the tip ends of the carbon nanotubes 14 is eliminated. Thereby, the tip ends of the carbon nanotubes 14 are exposed while the side surfaces of the carbon nanotubes 14 remain covered.

Referring to FIG. 2, after the resist is eliminated, polystyrene derivatives 16 are applied onto the silicon oxide film 12. At this time, the polystyrene derivatives 16 are included in a solvent, and applied by the spin casting method. The polystyrene derivative 16 consists of poly p-acetoxy styrene, for example. Further, the polystyrene derivative 16 is formed in size to such a degree that can gain entrance into an area surrounded by four adjacent carbon nanotubes 14. Then, the solvent used for application of the polystyrene derivatives 16 is volatilized. Simultaneously, the polystyrene derivatives 16 are arranged between the carbon nanotubes 14 because of self-organization.

Next, the polystyrene derivatives 16 are swelled by a solution such as propanol or ethylene glycol. Thereby, the size of the polystyrene derivative 16 is adjusted so as to be in contact with the respective four adjacent carbon nanotubes 14. The solution for swelling the polystyrene derivatives 16 is a solution including a material expressed by the following formula 1 or an alkaline solution:

[Formula 1]

Where R1, R2, and R3 are hydrogen or organic groups.

In place of the polystyrene derivative 16, a polystyrene derivative in which substituents such as tertiary-butoxy groups, tertiary-butoxy carbonyl oxy groups, and acetoxy groups are bonded in advance via an ether linkage or ester linkage to the fine particles may be used. These substituents desorb from the polystyrene derivative by being heated. Therefore, in the case where the polystyrene derivative is large in size to such a degree that can not gain entrance into the area surrounded adjacent carbon nanotubes 14, the polystyrene derivative may be heated. Since the substituents desorb from the polystyrene derivative by heat, the polystyrene derivative becomes small. Thereby, the polystyrene derivative after the substituents desorb therefrom can gain entrance into the area surrounded adjacent four carbon nanotubes 14.

The desorption temperature of the substituents can be checked by a TG (thermogravimetric analysis device) and the like. It is preferred that the polystyrene derivative is heated in an acid atmosphere (sulfuric acid, hydrochloric acid, etc.) or an alkaline atmosphere (ammonia gas etc.). This is because substituents can desorb from the polystyrene derivative at lower temperature than the case of heating them in an neutral atmosphere. Further, a high energy beam such as an excimer laser may be applied to the polystyrene derivative. Thereby, the substituents can easily desorb from the polystyrene derivative.

As described above, in the case where the polystyrene derivative 16 is too small, the polystyrene derivative 16 can be swelled by a solution such as propanol or ethylene glycol. On the other hand, using the polystyrene derivative 16 having the above described substituents, in the case where the polystyrene derivative 16 is too large, the polystyrene derivative 16 can be made smaller by being applied with energy such as heat and light.

In the embodiment, one polystyrene derivative 16 is disposed in the area surrounded adjacent four carbon nanotubes 14. However, with the surface of the silicon substrate 10 as reference, plural polystyrene derivatives 16 may be stacked according the height of the carbon nanotube 14 and the height of the polystyrene derivative 16. For example, in the case where the distance between the carbon nanotubes 14 is 2 µm, the height of the carbon nanotube 14 is 20 µm, and the diameter of the polystyrene derivative 16 is 2.5 µm, eight polystyrene derivatives 16 are stacked. Thereby, the polystyrene derivatives 16 are stacked substantially to the same height as that of the tip end of the carbon nanotube 14.

Referring to FIG. 3, then, an electrode material layer is deposited on the carbon nanotubes 14 and the polystyrene derivatives 16. For example, a Ti layer is vapor-deposited as the electrode material layer on the entire surface of the silicon substrate 10. The tip ends of the carbon nanotubes 14 are exposed. On the other hand, the side surfaces of the carbon nanotubes 14 are covered by the silicon oxide film and the polystyrene derivatives 16. Therefore, the electrode material layer is connected to the tip ends only of the carbon nanotubes 14.

Next, the polystyrene derivatives 16 are melted with toluene. Thereby, as shown in FIG. 3, the polystyrene derivatives 16 and the electrode material that has been existed thereon is eliminated. The part in which the polystyrene derivatives 16 have existed forms space. In the mesh area shown by the shaded part of FIG. 3, the electrode material layer remains as an electrode 18. Thereby, the tip ends of the carbon nanotubes 14 are electrically connected by the mesh form electrode 18. The wiring width of the electrode 18 is determined depending on the distance between adjacent two polystyrene derivatives 16. That is, the wiring width of the electrode 18 is nearly the same as the distance between adjacent two polystyrene derivatives 16.

Thus, according to the embodiment, the electrode 18 can be manufactured on the tip ends of the minute carbon nanotubes 14 in a self-alignment manner.

Figure 4:
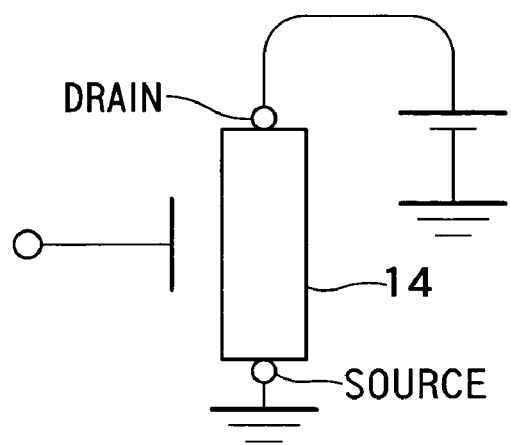
FIG. 4 is a circuit diagram of a transistor 100 with a carbon nanotube 14 as a single electron element.

FIG. 4 is a circuit diagram of a transistor 100 with the carbon nanotube 14 as a single electron element. The transistor 100 has a drain electrode on the tip end of the carbon nanotube 14. Conventionally, it has been impossible to provide a drain electrode to the tip end of each carbon nanotube 14. According to the embodiment, the electrode 18 can be manufactured as drain electrodes on the tip ends of the carbon nanotubes 14 in a self-alignment manner.

Further, it is preferred that the thickness of the silicon oxide film 12 is thin enough to be used as a tunnel film. Furthermore, according to the embodiment, an electrode can be manufactured on the tip end of a carbon nanotube formed by the method disclosed in the non-patent documents 6 and 2. In this case, there is no silicon oxide film 12 between the carbon nanotube 14 and the silicon substrate 10. Thereby, the carbon nanotube 14 and the silicon substrate 10 are electrically connected, and the silicon substrate 10 can be used as a source electrode.

According to the embodiment, a single electron element with the electrode 18 and the silicon substrate 10 as two terminals can be manufactured using a single carbon nanotube 14. By the way, as a material of the electrode 18, other then Ti, a conductive material such as Fe, Co, Ni, and Pd may be adopted. Further, as a material of the electrode 18, a multilayer film consisting of plural materials such as a multilayer film of Ti and Au may be used.

(Second Embodiment)

FIGS. 5 to 14 show processes of forming a single electron transistor element according to the second embodiment of the invention in the order of the processes. FIGS. 5, 6, 8, 9, and 12 show the structure on a silicon substrate 10 in sectional views. FIGS. 7, 10, 11, 13, and 14 show the structure on the silicon substrate 10 in plan views.

Figure 5:
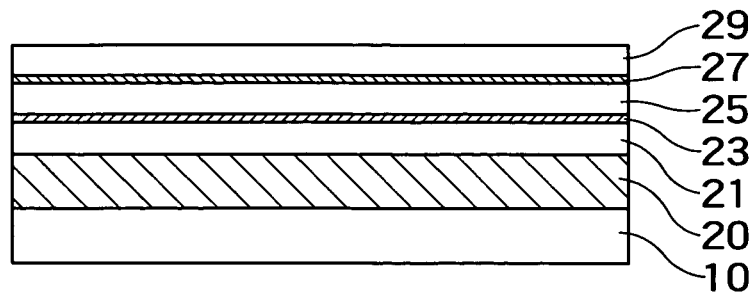
FIG. 5 shows a process of forming a single electron transistor element according to a second embodiment of the invention.

Referring to FIG. 5, first, a silicon oxide film 20 is formed on the silicon substrate 10 by oxidizing the silicon substrate 10. Then, an aluminum layer 21 having a thickness of about 10 nm is deposited on the silicon oxide film 20. An $Al_2O_3$ layer 23 having a thickness of about 1 nm is formed on the aluminum layer 21 by natural oxidization of the aluminum layer 21.

Next, an aluminum layer 25 having a thickness of about 2 nm is deposited on the $Al_2O_3$ layer 23. An $Al_2O_3$ layer 27 having a thickness of about 1 nm is formed on the aluminum layer 25 by natural oxidization of the aluminum layer 25. Further, an aluminum layer 29 having a thickness of about 10 nm is deposited on the $Al_2O_3$ layer. The aluminum layers 21, 25, and 29 may be deposited by a sputtering method.

Figure 6:
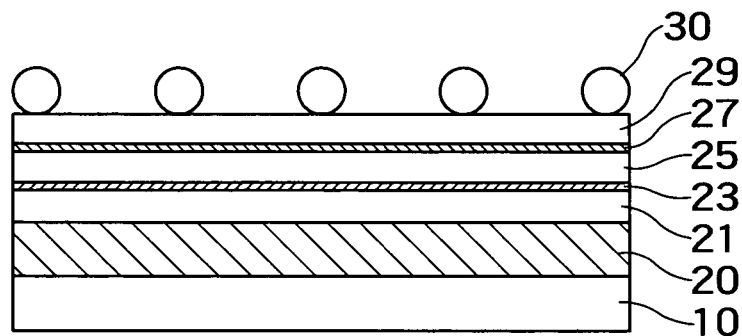
FIG. 6 shows a process subsequent to FIG. 5.

Referring to FIG. 6, a PMMA (Poly Methyl Methacrylate) resist is applied onto the aluminum layer 29, and the resist is patterned using the electron beam lithography. Thereby, grooves (not shown) are formed on the resist. Diblock copolymers 30 are arranged in the grooves. The diblock copolymers 30 can be arranged in the grooves by the method disclosed in Publication of Japanese Patent No. 2002-279616. For example, diblock copolymers consisting of polystyrene-polybutadiene are dissolved in a concentration of 1% w/w (mass fraction) in toluene. The resist surface is spin coated with this solution. Further, the silicon substrate 10 is placed in vacuum and annealed at 150° C. Thereby, the diblock copolymers 30 are arranged within the grooves of the resist.

The positions in which the diblock copolymers 30 are arranged depend on the positions of the grooves formed in the resist on the aluminum layer 29. Accordingly, in order to arrange the diblock copolymers 30 regularly on the aluminum layer 29, the grooves may be formed regularly in the resist on the aluminum layer 29. In the embodiment, the diblock copolymers 30 are arranged in a matrix form so that the distance Dc along the column direction of the adjacent diblock copolymers 30 may be shorter than the distance Dr along the row direction thereof.

Figure 7:
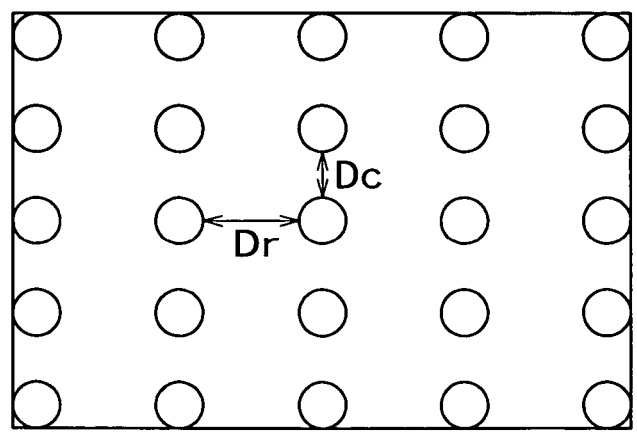
FIG. 7 shows a process subsequent to FIG. 6.

Next, the resist is eliminated from above the aluminum layer 29 while the diblock copolymers 30 remain on the aluminum layer 29. As a result, as shown in FIGS. 6 and 7, the diblock copolymers 30 are formed on the aluminum layer 29. By the way, before the diblock copolymers 30 are formed on the aluminum layer 29, a material for absorbing the diblock copolymers 30 may be deposited on the aluminum layer 29.

Figure 8:
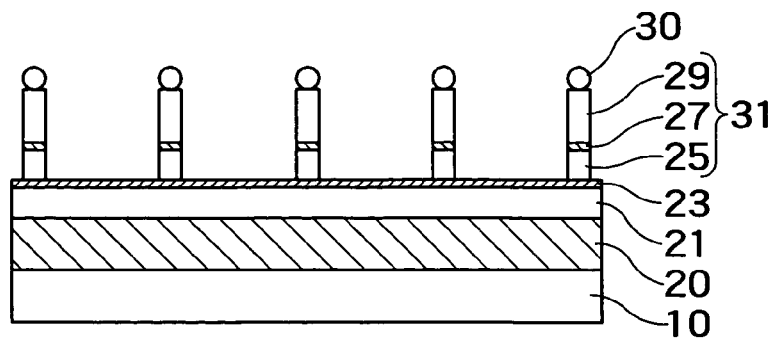
FIG. 8 shows a process subsequent to FIG. 7.

Referring to FIG. 8, the aluminum layer 29, the $Al_2O_3$ layer 27, and the aluminum layer 25 are sequentially etched by RIE (Reactive Ion Etching), milling, or the like using the diblock copolymers 30 as a mask. Thereby, protruding portions 31 consisting of the aluminum layer 29, the $Al_2O_3$ layer 27, and the aluminum layer 25 are formed under the diblock copolymers 30. Therefore, the protruding portions 31 are formed in the same number as that of the diblock copolymers 30. Further, the protruding portions 31 are arranged in a matrix form in the same manner as the arrangement of the diblock copolymers 30. The distance along the column direction between the adjacent protruding portions 31 is spaced by Dc, and the distance along the column direction therebetween is spaced by Dr. Further, the diblock copolymers 30 are eliminated from above the protruding portions 31.

Figure 9:
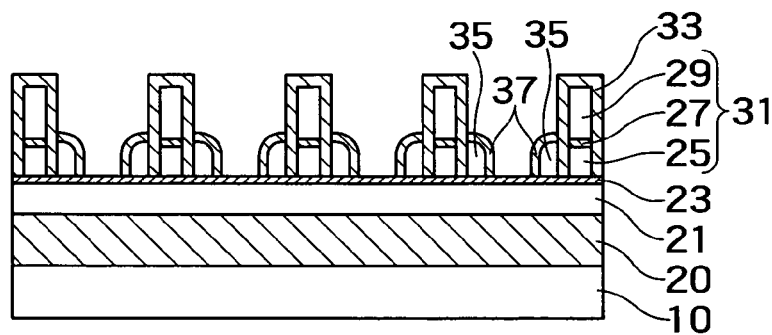
FIG. 9 shows a process subsequent to FIG. 8.
Figure 10:
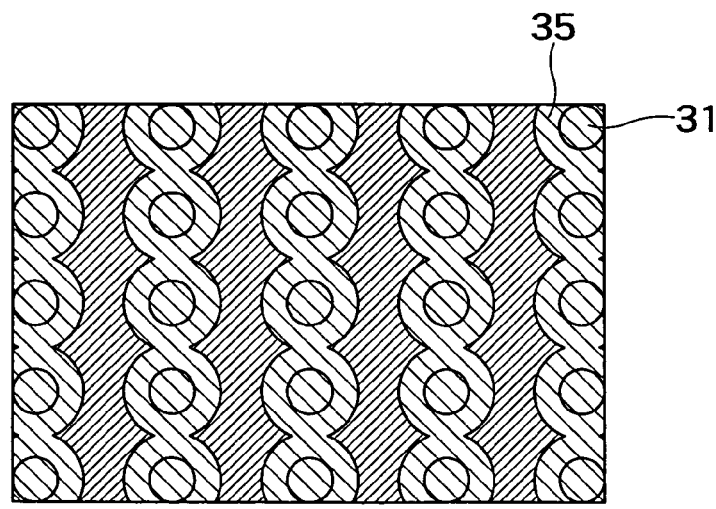
FIG. 10 shows a process subsequent to FIG. 9.

Referring to FIG. 9, a silicon oxide film 33 is deposited on the top surfaces and the side surfaces of the protruding portions 31 by the CVD method or the like. Then, polysilicon is deposited on the protruding portions 31 and the Al$_2$O$_3$ layer 23 by the CVD method or the like. Further, when the polysilicon is etched, the polysilicon remains on the boundaries between the side walls of the protruding portions 31 and the Al$_2$O$_3$ layer 23. This is utilized as gate electrodes 35. Since the distance Dc is shorter than the distance Dr, as shown in FIG. 10, the gate electrodes 35 formed on the side walls of the protruding portions 31 adjacent along the column direction are electrically connected to each other. On the other hand, the gate electrodes 35 formed on the side walls of the protruding portions 31 adjacent along the row direction are not electrically connected. In order to form the gate electrodes 35 in such arrangement, the thickness of the polysilicon deposited on the protruding portions 31 and the Al$_2$O$_3$ layer 23 and the etching amount of the polysilicon are adjusted.

Referring to FIG. 9 again, an insulative film 37 such as a silicon oxide film is formed on the gate electrode 35 by the CVD method or the like. The insulative film 37 may be a natural oxidization film formed on the surface of the gate electrodes 35.

In the embodiment, each of the cylindrical protruding portions 31 forms a single electron transistor element. The aluminum layer 21 is a common source to the protruding portions 31. The Al$_2$O$_3$ layers 23 and 27 serve as tunnel films and the aluminum layer 25 between them is an island. The aluminum layer 29 is a drain. By applying a potential to the gate electrode 35, the electrical charge tunneling to the aluminum layer 25 via the Al$_2$O$_3$ layers 23 and 27 can be controlled. By further miniaturizing the aluminum layer 25, the power consumption of the single electron transistor element can be reduced.

Figure 11:
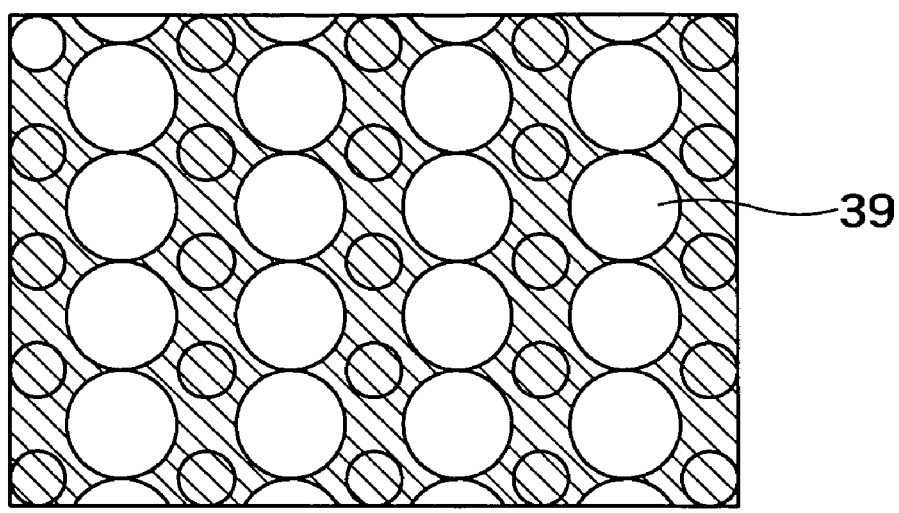
FIG. 11 shows a process subsequent to FIG. 10.

Referring to FIG. 11, polystyrene derivatives 39 having OH groups are dispersed in pure water and this solution is applied onto the elements by the spin casting method. The polystyrene derivative 39 is poly p-hydroxy styrene, for example. When the pure water is evaporated, the polystyrene derivative 39 gains entrance into an area surrounded by four protruding portions 31.

Next, the size of the polystyrene derivative 39 is adjusted so that the polystyrene derivatives 39 adjacent along the column direction of the protruding portions 31 may be made in contact with each other and the polystyrene derivatives 39 adjacent along the row direction of the protruding portions 31 may not be made in contact. The method for changing the size of the polystyrene derivative 39 may be the same as the method for changing the size of the polystyrene derivative 16 in the first embodiment.

Figure 12:
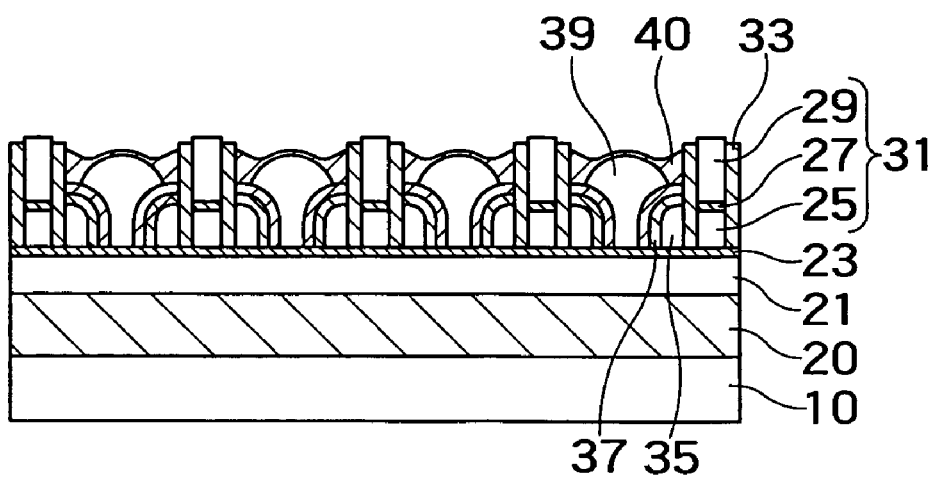
FIG. 12 shows a process subsequent to FIG. 11.

Referring to FIG. 12, then, a resist layer 40 consisting of PMMA is applied onto the elements. Then, by etching back the resist 40, the silicon oxide film on the tip ends of the protruding portions 31 is eliminated. Thereby, the aluminum layer 29 on the tip end of the protruding portion 31 is exposed while the side surface of the protruding portion 31 remains covered by the silicon oxide film 33.

Figure 13:
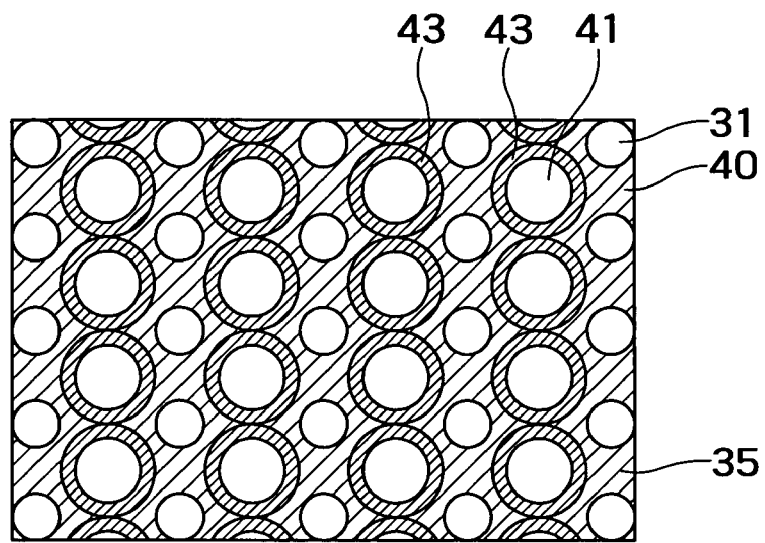
FIG. 13 shows a process subsequent to FIG. 12.

Referring to FIG. 13, then, the polystyrene derivatives 39 are dissolved with a tetra-methyl-ammonium alkaline solution. Simultaneously, the resist on the polystyrene derivatives 39 is eliminated. Therefore, a recess 43 having the same size as the polystyrene derivative 39 is formed between the four protruding portions 31. On the other hand, the resist on the gate electrodes 35 remains.

Next, polystyrene derivatives 41 having substituents such as t-butoxy carbonyl oxy groups etc. are applied onto the elements. At this time, the polystyrene derivatives 41 are included in a solvent and applied by the spin casting method. The polystyrene derivative 41 can be formed so small as to gain entrance into the side wall of the recess 43 and provide space between the polystyrene derivative 41 and the recess 43. In the case where the polystyrene derivative 43 is too large to gain entrance into the recess 43, heat or light is applied to the polystyrene derivative 41. Thereby, the substituents desorb from the polystyrene derivatives 41, the polystyrene derivatives 41 become smaller, and the polystyrene derivatives 41 can be introduced into the respective recesses 43.

Figure 14:
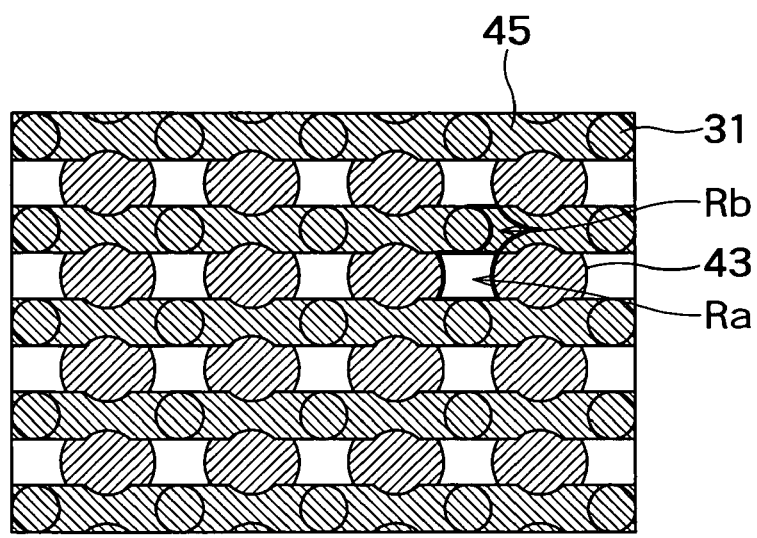
FIG. 14 shows a process subsequent to FIG. 13.

Referring to FIG. 14, then, an electrode material such as Al is vapor-deposited on the elements. Further, the polystyrene derivatives 41 are dissolved with toluene. Simultaneously, the electrode material that has existed on the polystyrene derivatives 41 is eliminated. Therefore, the electrode material remains in a mesh form.

Next, the resist layer 40 is eliminated. At this time, the resist within areas Ra surrounded by the protruding portions 31 adjacent along the column direction and the recesses 43 adjacent along the row direction and having a relatively larger area is eliminated. Simultaneously, the electrode material on the resist within the areas Ra is lifted off. On the other hand, the resist within areas Rb substantially surrounded by the recesses 43 adjacent along the column direction and their neighborhood protruding portions 31 remains. Thereby, as shown in FIG. 14, drain electrodes 45 are formed in a striped manner.

There are some cases where a burr of the electrode material remains in a band shape between the drain electrodes 45 adjacent in the column direction. In this case, the burr is melted by allowing current to flow in the drain electrodes 45. Thereby, the short between the drain electrodes 45 can be cut off.

As described above, according to the embodiment, the gate electrodes 35 can be formed along the column direction in which the distance between the adjacent protruding portions 31 is shorter, and the drain electrodes 45 can be formed along the row direction in which the distance between the adjacent protruding portions 31 is larger. According to the embodiment, the drain electrodes 45 can be formed on the minute protruding portions 31 in a self-alignment manner.

In the embodiment, in place of the aluminum layers 21, 25, and 29, a metal such as Fe, Ni, Cu, and Nb may be adopted. Further, in place of the aluminum layers 21, 25, and 29, a silicon material such as poly Si or amorphous Si may be adopted. In the case where a silicon material is used in place of the aluminum layers 21, 25, and 29, for matching of materials, a silicon oxide film is preferably used as a tunnel film in place of Al$_2$O$_3$ layers 23 and 27.

In the embodiment, the protruding portion 31 has the only one aluminum layer 25 between the tunnel films 23 and 27. However, three or more layers of tunnel films and two or more layers of aluminum layers between the tunnel films may be provided. Further, there may be no tunnel film 27, and only one aluminum layer 23 may be provided on the tunnel film 23.

In the embodiment, the material of the gate electrode 35 is polysilicon, however, the material of the gate electrode 35 may be a semiconductor or metal other than polysilicon. Further, in the embodiment, the gate electrode 35 is formed by the method for leaving the side wall by etching the electrode material to remain. However, in place of the method, after the process shown in FIG. 8, polystyrene derivatives 39 may be placed between the adjacent four protruding portions 31, and then, polysilicon, a gate protective insulative film, and a resist layer may be deposited, and the polystyrene derivatives 39 may be eliminated. The gate electrode 35 can be also formed by the method.

In the embodiment, in place of the protruding portions 31, carbon nanotubes formed by the method disclosed in the non-patent document 2 may be used. In this case, a three-terminal element using the carbon nanotube can be manufactured.

Further, as a method for arranging the particles serving as a mask such as the diblock copolymers 30 on the aluminum layer 29, a method utilizing a colloid solution of metal fine particles as disclosed in Publication of Japanese Patent Application No. Hei-7-226522 may be used. Alternatively, a method utilizing an STM (Scanning Tunneling Microscope) or AFM (Atomic Force Microscope) as disclosed in Publication of Japanese Patent Application No. 2001-7315 may be used.

(Third Embodiment)

Figure 15:
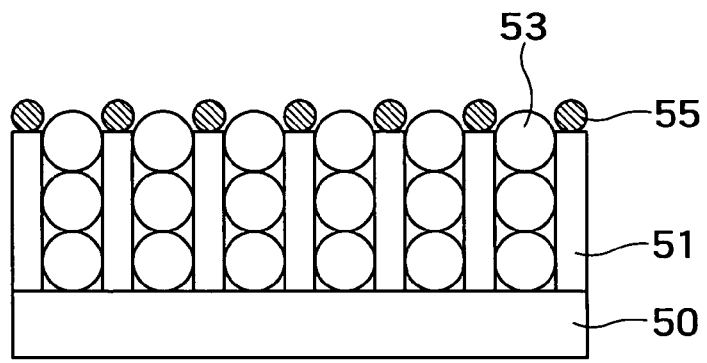
FIG. 15 is a sectional view showing a manufacturing process of a field emitter according to a third embodiment of the invention.
Figure 16:
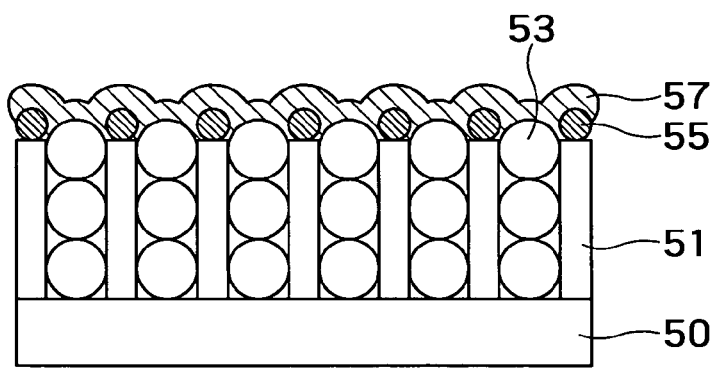
FIG. 16 shows a process subsequent to FIG. 15.
Figure 17:
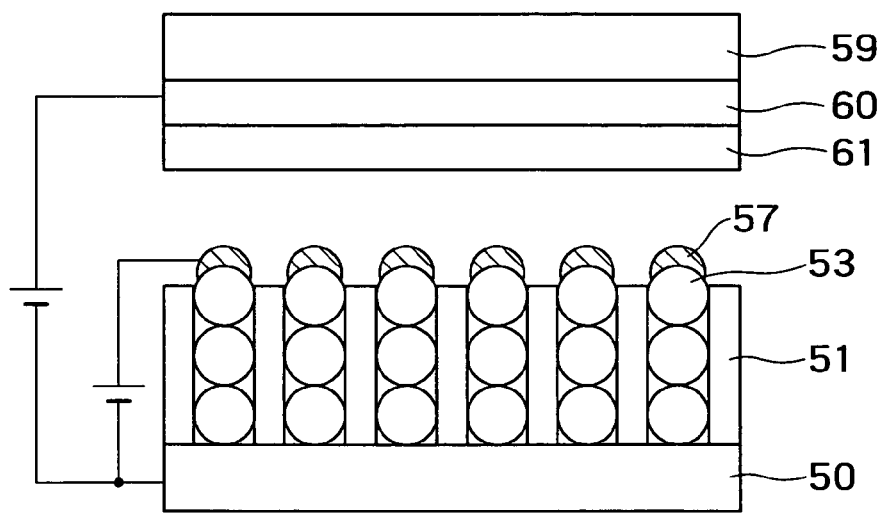
FIG. 17 shows a process subsequent to FIG. 16.

FIGS. 15 to 17 are sectional views showing manufacturing processes of a field emitter according to the third embodiment of the invention in the order of the processes. Referring to FIG. 15, first, carbon nanotubes 51 are arranged in a matrix form on a substrate 50. The carbon nanotubes 51 are formed by the method disclosed in the non-patent document 2.

Then, polystyrene derivatives 53 are applied onto the substrate 50. At this time, the polystyrene derivatives 53 are included in a solvent, and applied by the spin casting method. When the solvent is volatilized, the polystyrene derivatives 53 are arranged between the carbon nanotubes 51. At that time, the size of the polystyrene derivative 53 may be changed in the same manner as in the first embodiment. The polystyrene derivatives 53 are designed so as to have top portions higher than the tip ends of the carbon nanotubes 51 when arranged between the carbon nanotubes 51. Alternatively, by stacking plural of the polystyrene derivatives 53, the top portion of the uppermost polystyrene derivative 53 is made higher than the carbon nanotube 51. Further, the size of the polystyrene derivative 53 is changed so that the surface of the substrate 50 may not be exposed to the outside. The polystyrene derivative 53 consists of poly p-acetoxy styrene, for example.

Next, polystyrene derivatives 55 having OH groups are dispersed in a solvent and this solution is applied onto elements by the spin casting method. By volatilizing the solution, the polystyrene derivatives 55 are arranged between the polystyrene derivatives 53. The polystyrene derivative 55 is poly p-hydroxy styrene, for example.

Referring to FIG. 16, then, an electrode material 57 such as Al is vapor-deposited on the polystyrene derivatives 53 and 55.

Referring to FIG. 17, then, the polystyrene derivatives 55 and 53 are exposed to a tetra-methyl-ammonium alkaline solution. Since the polystyrene derivatives 53 have no OH group and no water solubility, they are not dissolved with the tetra-methyl-ammonium alkaline solution. Since the polystyrene derivatives 55 have OH groups and water solubility, they are dissolved with the tetra-methyl-ammonium alkaline solution. Accordingly, the polystyrene derivatives 55 can be dissolved with the tetra-methyl-ammonium alkaline solution while the polystyrene derivatives 53 are allowed to remain. By the elimination of the polystyrene derivatives 55, the electrode material 57 on the polystyrene derivatives 55 is lifted off. Thereby, the electrode material 57 can be formed on the peripheries of the tip ends of the carbon nanotubes 51. The electrode material 57 serves as gate electrodes and emits electrons from the tip ends of the carbon nanotubes 51.

Further, a glass substrate 59 having an anode electrode 60 and a fluorescent material 61 is disposed so as to be opposed to the substrate 50. Light is emitted when the electrons emitted from the tip ends of the carbon nanotubes 51 reach the fluorescent material 61. According to the embodiment, the gate electrode 57 can be formed on the periphery of the tip end of the carbon nanotube 51 serving as a field emitter in a self-alignment manner.

In the embodiment, two kinds of polystyrene derivatives are used, however, three or more kinds of polystyrene derivatives or other fine particles may be used according to the shape of the electrode. Further, in the embodiment, the carbon nanotube is adopted as a field emitter, in place of the carbon nanotube, other protruding electrode material may be adopted as a field emitter.

(Fourth Embodiment)

Figure 18:
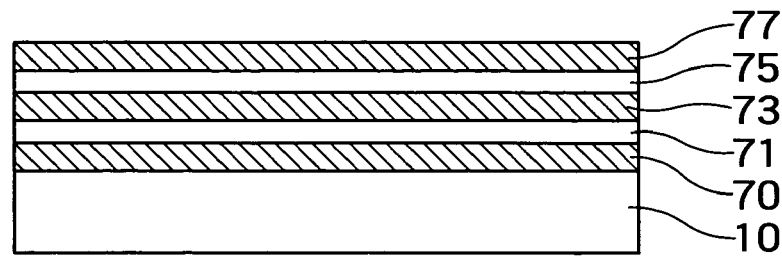
FIG. 18 is a sectional view showing a manufacturing process of a quantum bit according to a fourth embodiment of the invention.
Figure 19:
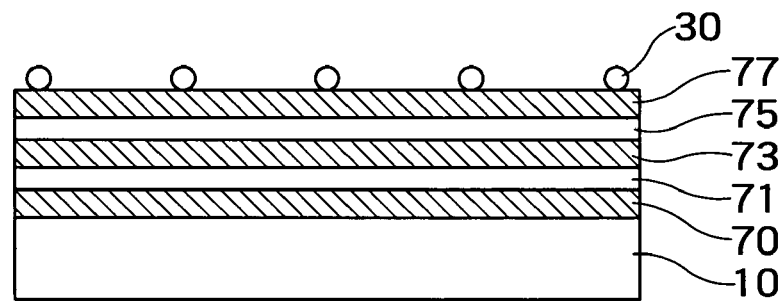
FIG. 19 shows a process subsequent to FIG. 18.
Figure 20:
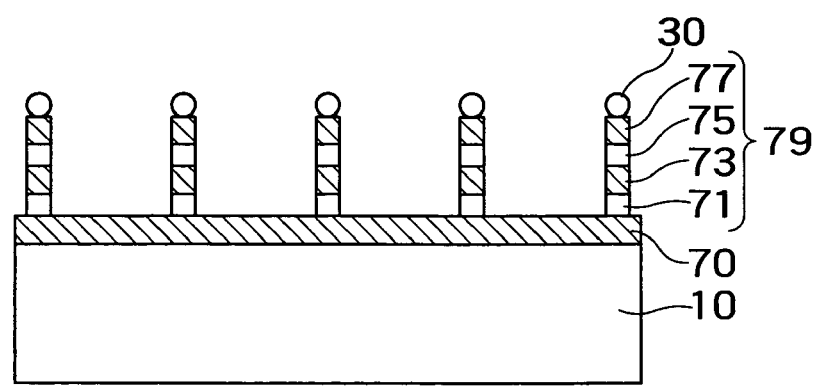
FIG. 20 shows a process subsequent to FIG. 19.

FIGS. 18 to 24 are sectional views showing manufacturing processes of a quantum bit (qubit) according to the fourth embodiment of the invention in the order of the processes. FIGS. 18 to 20 show the structure on a silicon substrate 10 in sectional views. FIGS. 21 to 24 show the structure on the silicon substrate 10 in plan views. The embodiment is a method for manufacturing an electrode on a quantum bit formed by electrically bonding two quantum dots, which is disclosed in the non-patent document 5.

Referring to FIG. 18, first, an element area is formed on the surface of the silicon substrate 10, and a silicon oxide film 70 having a thickness of about 7 nm is formed on the surface of the silicon substrate 10. Then, a polysilicon layer 71 having a thickness of about 5 nm is deposited on the silicon oxide film 70 by the CVD method or the like. A silicon oxide film 73 is formed on the polysilicon layer 71 by the CVD method or the like. A polysilicon layer 75 having a thickness of about 5 nm is deposited on the silicon oxide film 73 by the CVD method or the like. A silicon oxide film 77 is formed on the polysilicon layer 75 by the CVD method or the like.

Referring to FIG. 19, then, in the same manner as in the second embodiment, diblock copolymers 30 are formed on the silicon oxide film 77.

Referring to FIG. 20, then, the silicon oxide film 77, the polysilicon layer 75, the silicon oxide film 73, and the polysilicon layer 71 are anisotropically etched by RIE using the diblock copolymers 30 as a mask. Thereby, protruding portions 79 consisting of the silicon oxide film 77, the polysilicon layer 75, the silicon oxide film 73, and the polysilicon layer 71 are formed on the silicon oxide film 70.

After the diblock copolymers 30 are eliminated, the silicon substrate 10 is heated to about 800° C. Thereby, the polysilicon layers 71 and 75 are crystallized. The polysilicon layer 71, the silicon oxide film 73, and the polysilicon layer 75 constitute a quantum bit.

Figure 21:
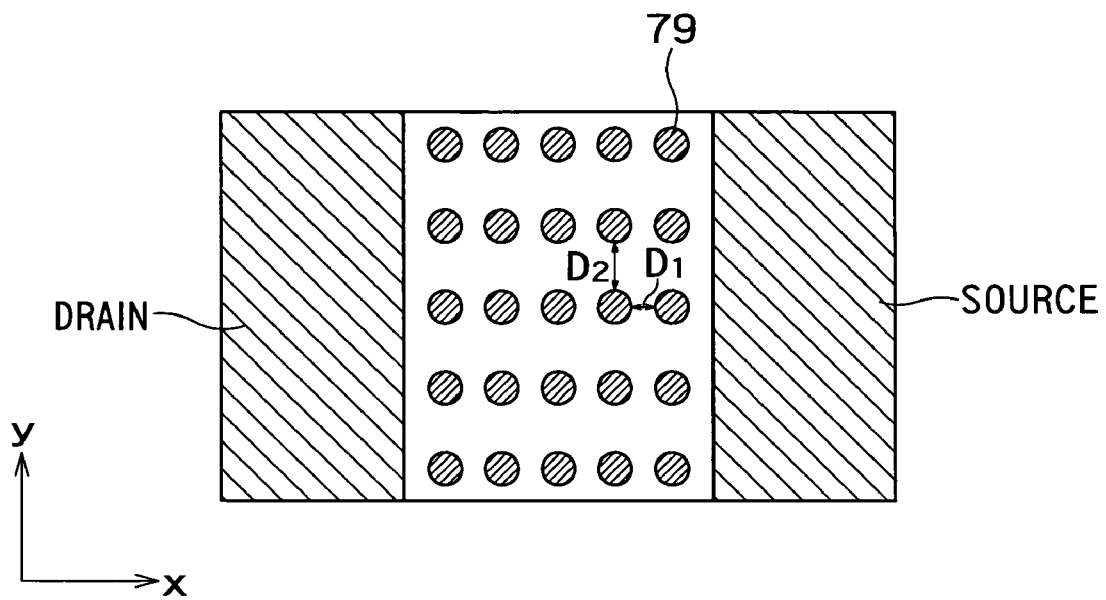
FIG. 21 shows a process subsequent to FIG. 20.

As shown in FIG. 21, the protruding portions 79 are formed in a matrix form between a source and a drain. The protruding portions 79 are arranged at distances $D_1$ along the source-drain direction (x direction) in which channel current flows. On the other hand, the protruding portions 79 are arranged at distances $D_2$ along the direction (y direction) perpendicular to the source-drain direction. Here, the distance $D_1$ is shorter than the distance $D_2$. The quantum dots are arranged in the same manner as the protruding portions 79.

Figure 22:
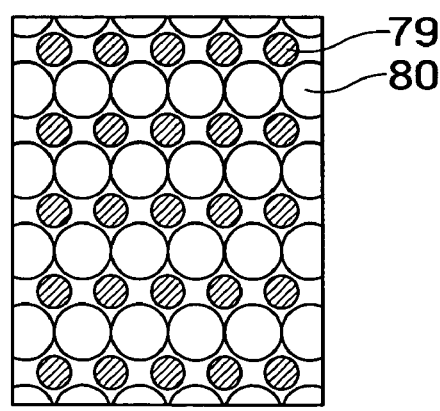
FIG. 22 shows a process subsequent to FIG. 21.

Referring to FIG. 22, first, polystyrene derivatives 80 having t-butoxy carbonyl oxy groups are applied onto the silicon substrate 10. At this time, the polystyrene derivatives 80 are included in pure water and applied by the spin casting method. The polystyrene derivative 80 is poly p-hydroxy styrene, for example. Then, when the pure water is evaporated, the polystyrene derivative 80 are arranged between the protruding portions 79. Here, as shown in FIG. 22, the polystyrene derivatives 80 arranged in x direction are close to each other, and the polystyrene derivatives 80 arranged in y direction are separated from each other. By the way, the size of the polystyrene derivative 80 can be changed in the same manner as the polystyrene derivative 16 in the first embodiment.

Figure 23:
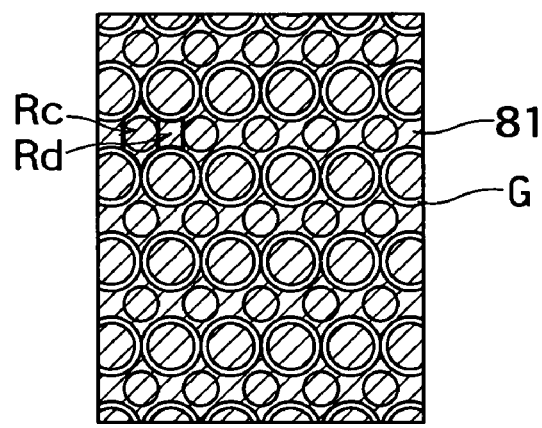
FIG. 23 shows a process subsequent to FIG. 22.

Referring to FIG. 23, then, a resist layer 81 of PMMA or the like is applied onto the protruding portions 79 and the polystyrene derivatives 80. Then, heat or light is applied to the polystyrene derivative 80 and the substituents of the polystyrene derivatives 80 are desorbed. Thereby, the polystyrene derivatives 80 become smaller, and gaps G are formed on the peripheries of the polystyrene derivatives 80. Then, the protruding portions 79 are exposed by etching back the resist layer.

Figure 24:
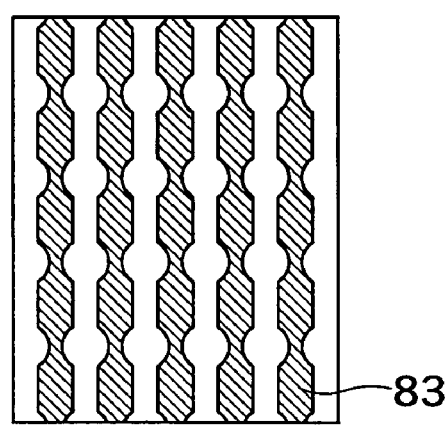
FIG. 24 shows a process subsequent to FIG. 23.

Referring to FIG. 24, then, an electrode material such as Al is vapor-deposited. Then, the resist layer 81 is eliminated. At this time, because of the arrangement of the polystyrene derivatives 80, the area Rd shown in FIG. 23 is smaller than the area Rc. Therefore, the resist layer 81 within the areas Rd is eliminated, and the resist layer 81 within the areas Rc remains. Accordingly, the electrode material within the areas Rd is lifted off.

Further, the polystyrene derivatives 80 are eliminated with toluene etc. Thereby, the electrode material on the polystyrene derivatives 80 is lifted off. As a result, as shown in FIG. 24, electrode wiring 83 is formed along the y axis direction on the quantum bit.

By the way, another polystyrene derivatives may be provided under the polystyrene derivatives 80 so that the top potions of the polystyrene derivatives 80 are formed so as to be located near the tip ends of the protruding portions 79.

Since the polysilicon layer 71 and the polysilicon layer 75 shown in FIG. 20 serve as two quantum dots, hereinafter, these are referred to as quantum dots 71 and 75. Since the silicon oxide film 73 serves as a tunnel film between the quantum dots 71 and 75, hereinafter, this is referred to as a tunnel oxide film 73. Further, since the electrode 83 shown in FIG. 24 serves as a gate electrode, this is referred to as a gate electrode 83.

The quantum dots 71 and 75 formed according to the embodiment are bonded by the tunnel oxide film 73. The quantum dots 71 and 75 form a quantum bit as a basic component element of quantum computing. The gate electrode 83 is mounted on the tip end of the quantum bit and controls electrical charges within the quantum dots 71 and 75. Thereby, a result of the quantum computing by the quantum bit can be measured as substrate current caused by MOS structure. The embodiment can form the gate electrode 83 for connecting the tip end portions of the quantum bits in a self-alignment manner.

Further, the gate electrode 83 extends along the direction (y direction) substantially perpendicular to the direction (x direction) of the channel current flowing between the source and the drain shown in FIG. 21. Thereby, the quantum bits arrange in y direction execute the same quantum computing. The average of the computation result is read into a peripheral circuit as channel current. Since the plural quantum bits execute the same quantum computing, an error in the quantum computing can be prevented.

Note that, distances of the protruding portions 79 along the row direction (x direction) are shorter, and the distances thereof along the column direction (y direction) are longer. However, such an arrangement is for convenience, and distances of the protruding portions 79 along the row direction (x direction) may be longer, and the distances thereof along the column direction (y direction) may be shorter. In this case, the source and the drain are formed on both sides of the column direction (y direction).

(Fifth Embodiment)

Figure 25:
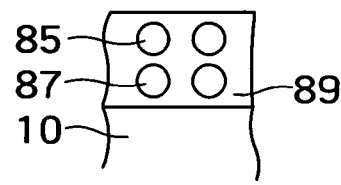
FIG. 25 is a sectional view showing a manufacturing process of an electrode of a quantum bit according to a fifth embodiment of the invention.

FIGS. 25 to 29 are sectional views showing manufacturing processes of an electrode of a quantum bit according to the fifth embodiment of the invention in the order of the processes. The embodiment forms a gate electrode on the quantum dots that have been already formed. Referring to FIG. 25, first, quantum dots 85 and 87 are formed in a silicon oxide film 89 by the method disclosed in U.S. Pat. No. 6,060,743 by Sugiyama et al. The quantum dots 85 and 87 consist of silicon, for example.

Figure 26:
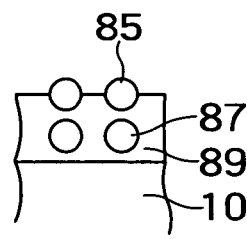
FIG. 26 shows a process subsequent to FIG. 25.

Referring to FIG. 26, then, the silicon oxide film 89 is etched with hydrofluoric acid or the like, and the upper portions of the quantum dots 85 are exposed.

Figure 27:
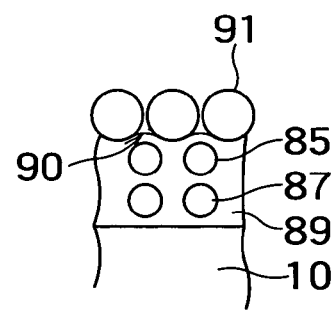
FIG. 27 shows a process subsequent to FIG. 26.

Referring to FIG. 27, then, the exposed portions of the quantum dots 85 are oxidized. Instead of oxidizing the quantum dots 85, a silicon oxide film may be deposited on the quantum dots 85 by the CVD method or the like. Thereby, parts of the silicon oxide film existing on the quantum dots 85 protrude. Hereinafter, these are referred to as protruding portions 90.

Next, polystyrene derivatives 91 are applied onto elements. The polystyrene derivatives 91 are included in a solvent, and the solvent is applied onto the substrate by the spin casting method or the like. Then, by volatilizing the solution, the polystyrene derivatives 91 are arranged between the protruding portions 90. The size of the polystyrene derivative 91 can be changed in the same manner as the polystyrene derivative 16 in the first embodiment.

Figure 28:
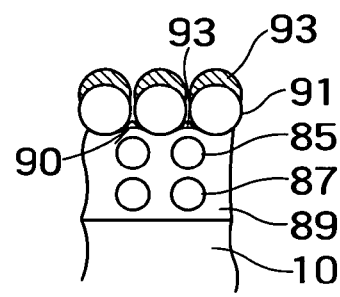
FIG. 28 shows a process subsequent to FIG. 27.
Figure 29:
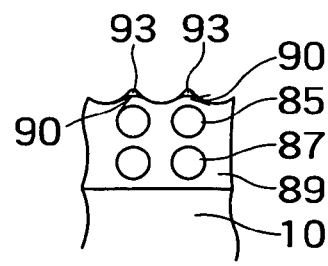
FIG. 29 shows a process subsequent to FIG. 28.

Referring to FIG. 28, then, an electrode material such as Al or polysilicon is deposited on the protruding portions 90 and the polystyrene derivatives 91. Then, the polystyrene derivatives 91 are eliminated with toluene etc. Thereby, the electrode material 93 on the polystyrene derivatives 91 is lifted off. On the other hand, the electrode material 93 on the protruding portions 90 remains as gate electrodes. According to the embodiment, thus, the gate electrodes can be formed on the quantum dots 85 and 87 in a self-alignment manner.

(Sixth Embodiment)

FIGS. 30 to 34 are plan views showing manufacturing processes of a quantum bit according to the sixth embodiment of the invention in the order of the processes. First, according to FIGS. 18 to 21, protruding portions 79 are formed on a silicon oxide film 70.

Figure 30:
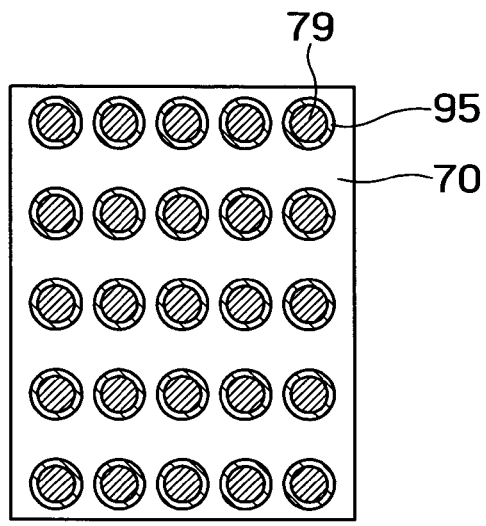
FIG. 30 is a plan view showing a manufacturing process of a quantum bit according to a sixth embodiment of the invention.

Referring to FIG. 30, then, polysilicon is deposited onto elements. Polysilicon 95 remains on side surfaces between the protruding portions 79 and the silicon oxide film 70 by etching the polysilicon. In the embodiment, the polysilicon 95 remains on the peripheries of the respective protruding portions 79 and not connected between adjacent protruding portions 79.

Figure 31:
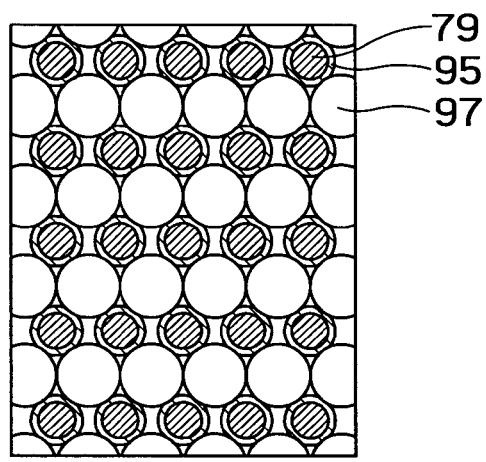
FIG. 31 shows a process subsequent to FIG. 30.

Referring to FIG. 31, then, polystyrene derivatives 97 having substituents such as t-butoxy carbonyl oxy groups etc. are applied. At this time, the polystyrene derivatives 97 are dispersed in pure water and this pure water is applied onto the silicon substrate 10 by the spin casting method. The polystyrene derivative 97 is poly-tertiary butoxy carbonyl oxy styrene, for example. Then, by evaporating the pure water, the polystyrene derivatives 97 are arranged between the protruding portions 79. The size of the polystyrene derivative 97 can be changed in the same manner as the polystyrene derivative 16 in the first embodiment.

Figure 32:
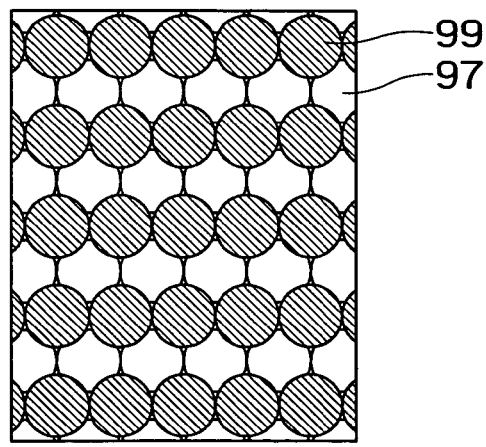
FIG. 32 shows a process subsequent to FIG. 31.
Figure 33:
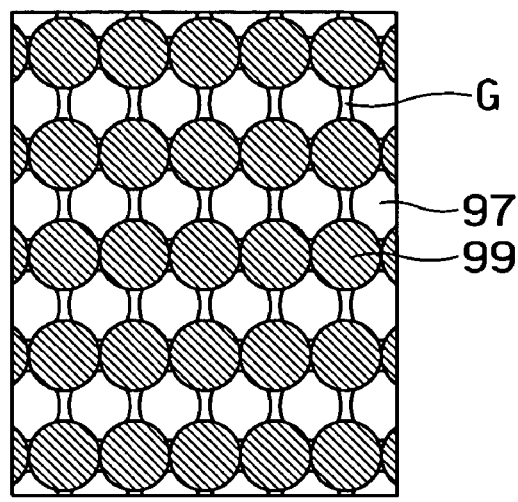
FIG. 33 shows a process subsequent to FIG. 32.

Referring to FIG. 32, then, polystyrene derivatives 99 having OH groups are dispersed in pure water and this solution is applied onto the elements by the spin casting method. The size of the polystyrene derivative 99 can also be changed in the same manner as the polystyrene derivative 16 in the first embodiment. By adjusting the size of the polystyrene derivative 99, the polystyrene derivatives 99 are arranged on the protruding portions 79, that is, on the quantum dots 71 and 75 as shown in FIG. 32. Then, heat or light is applied to the polystyrene derivatives 97. Thereby, the substituents desorb from the polystyrene derivatives 97 and the polystyrene derivatives 97 become small. As a result, as shown in FIG. 33, gaps G are formed between the polystyrene derivatives 97.

Figure 34:
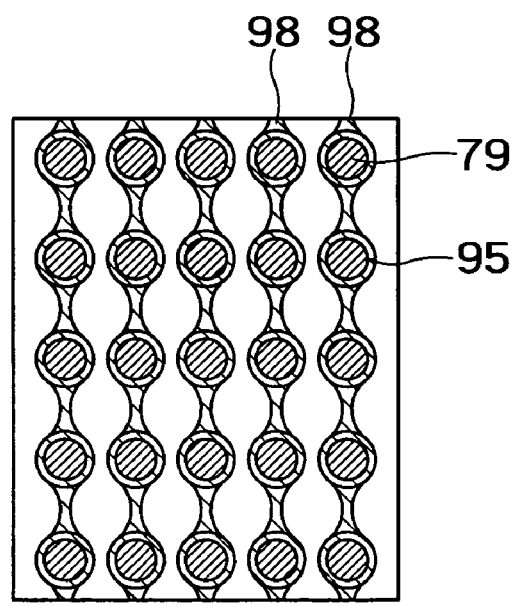
FIG. 34 shows a process subsequent to FIG. 33.

Referring to FIG. 34, then, polysilicon is deposited from above the polystyrene derivatives 97 and 99. Further, the polysilicon is etched isotropically. Since the polysilicon is deposited relatively thickly in the gaps, after the etching, the polysilicon remains between the polystyrene derivatives 97.

Further, the polystyrene derivatives 97 and 99 are eliminated. Thereby, the polysilicon 98 connected along y direction shown in FIG. 21 can be formed as gate electrodes in a self-alignment manner.

In the fourth to sixth embodiments, the tunnel film between quantum dots may be a high dielectric material such as hafnium oxide or aluminum oxide. Further, in fourth to sixth embodiments, two quantum dots are formed from the same material. However, two quantum dots may be formed from different materials from each other. For example, in FIG. 18, a silicon nitride film, polysilicon, and a silicon oxide film are sequentially deposited on the substrate 10 by the CVD or the like. Further, through the processes shown in FIGS. 19 to 24, gate electrodes can be formed on protruding portions consisting of the silicon nitride film, the polysilicon, and the silicon oxide film. According to the constitution, two trap levels are formed by the silicon nitride film, the polysilicon, and the silicon oxide film. A quantum bit with these two trap levels as quantum dots is formed.

In addition, the fourth to sixth embodiments can be applied to bonded quantum dots using silicon carbide, which is disclosed in Publication of Japanese Patent Application 2002-100687. The fourth to sixth embodiments can form wiring in a quantum computing machine using spin, which is disclosed in D. Loss et al., "Phys. Rev. A57, p120 (1998)".

The diblock copolymer 30 shown in FIGS. 8 and 19 may be formed using STM or AFM as disclosed in the publication No. 2001-7315. Alternatively, the diblock copolymer 30 may be formed using a colloid solution of metal fine particles as disclosed in the publication No. Hei-7-226522.

Note that distances of the protruding portions 79 along the row direction are shorter, and the distances thereof along the column direction are longer. However, such an arrangement is for convenience, and distances of the protruding portions 79 along the row direction may be longer, and the distances thereof along the column direction may be shorter.

(Embodiment 7)

Figure 35:
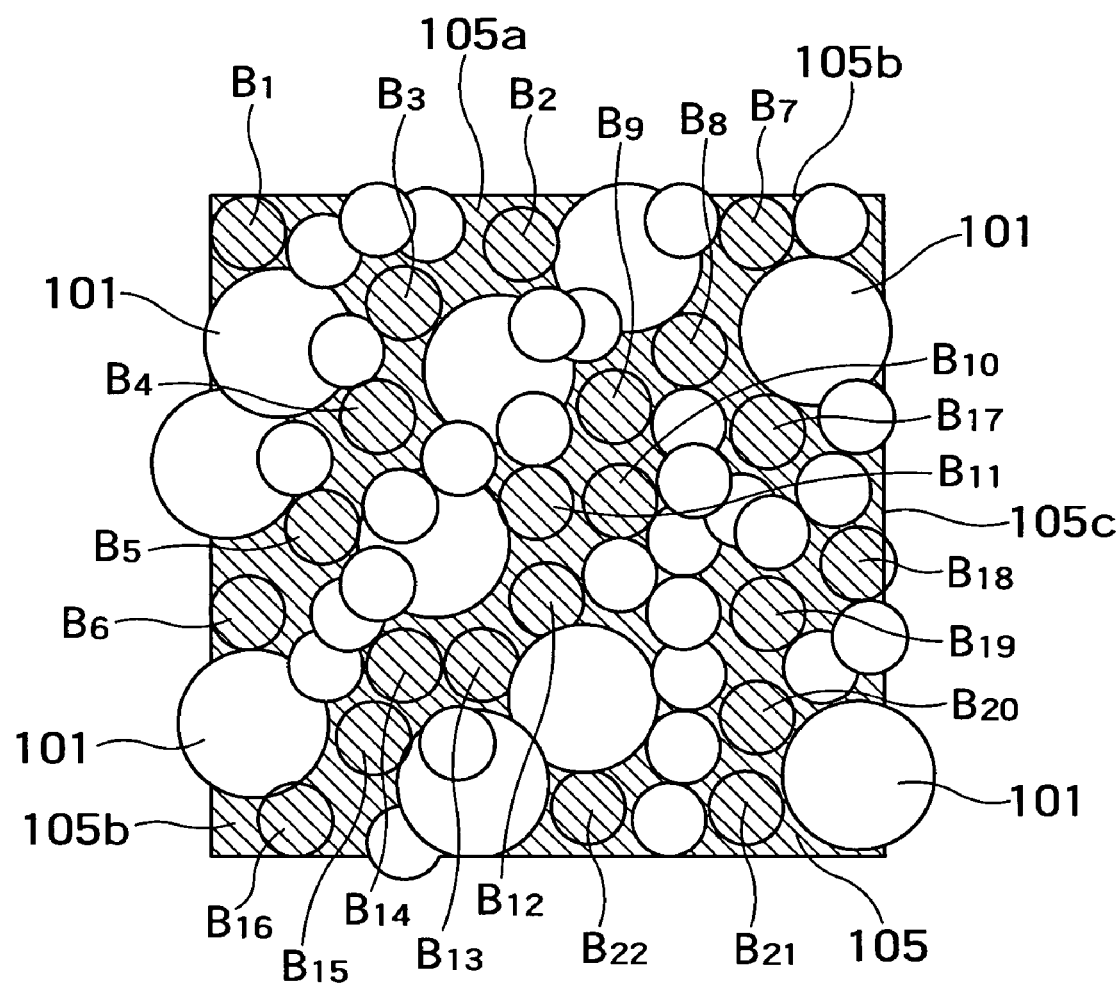
FIG. 35 is a plan view showing an electrode manufacturing method according to a seventh embodiment of the invention.

FIG. 35 is a plan view showing an electrode manufacturing method according to the seventh embodiment of the invention. In the first to sixth embodiments, the protruding portions such as carbon nanotubes and quantum dots are arranged regularly like a crystal lattice. However, in this embodiment, protruding portions are arranged irregularly on a substrate.

In FIG. 35, protruding portions B1 to B22 are arranged irregularly on a substrate. This embodiment forms electrodes on the tip ends of the protruding portions B1 to B22. First, polystyrene derivatives 101 having a relatively larger particle size are applied onto the substrate. At this time, the polystyrene derivatives 101 are included in a solvent, and applied by the spin casting method. By volatilizing the solvent, the polystyrene derivatives 101 are arranged between the protruding portions B1 to B22. The polystyrene derivative 101 consists of poly p-acetoxy styrene, for example.

The method for changing the size of the polystyrene derivative 101 may be the same as the method for changing the size of the polystyrene derivative 16 in the first embodiment. The case where the size of the polystyrene derivative 101 is changed is the case where the polystyrene derivatives 101 are required to be made smaller so as to gain entrance between the protruding portions B1 to B22, the case where the polystyrene derivatives 101 are required to be made larger so as to be sandwiched between plural of the protruding portions B1 to B22, or the like.

Next, polystyrene derivatives 103 having a relatively smaller particle size than the polystyrene derivatives 101 are applied onto the substrate. At this time, the polystyrene derivatives 103 are included in a solvent, and applied by the spin casting method. By volatilizing the solvent, the polystyrene derivatives 101 gain entrance into in areas where the polystyrene derivatives 101 can not enter among the gaps of the protruding portions B1 to B22. The polystyrene derivative 103 consists of poly p-acetoxy styrene, for example.

The method for changing the size of the polystyrene derivative 103 may be the same as the method for changing the size of the polystyrene derivative 16 in the first embodiment as well as the polystyrene derivatives 101.

Next, an electrode material is deposited on the protruding portions B1 to B22 and the polystyrene derivatives 101 and 103. Then, the polystyrene derivatives 101 and 103 are dissolved with toluene or a alkaline solution. Thereby, the electrode material formed on the polystyrene derivatives 101 and 103 can be eliminated while the electrode material formed on the protruding portions B1 to B22 is allowed to remain. As a result, as shown by the shaded area in FIG. 17, the electrodes 105a to 105c are formed on the protruding portions B1 to B22. In FIG. 17, the protruding portions B2 to B6 are electrically connected by the electrode 105a, the protruding portions B7 to B16 are electrically connected by the electrode 105b, and further, the protruding portions B18 to B21 are electrically connected by the electrode 105c.

In the case where the gap between the protruding portions is smaller than the particle size of the polystyrene derivative, the polystyrene derivatives do not gain entrance into the gaps between the protruding portions, and thereby, electrical wiring is formed between the protruding portions. On the other hand, in the case where the gap between the protruding portions is larger than the particle size of the polystyrene derivative, the polystyrene derivatives gain entrance into the gaps between the protruding portions, and thereby, electrical wiring is not formed between the protruding portions. Thus, even when the protruding portions are irregularly arranged on the substrate, according to the embodiment, positions where electrical wiring is formed can be controlled by the gaps between the protruding portions and particle sizes of the polystyrene derivatives.

The above described embodiments form electrodes utilizing lift-off. The following eighth and ninth embodiments can form electrodes in microstructures independent from lift-off.

(Eighth Embodiment)

Figure 36:
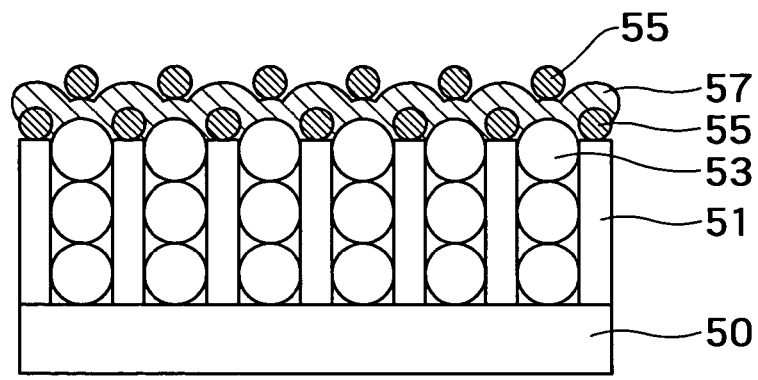
FIG. 36 is a sectional view showing a manufacturing process of a field emitter according to an eighth embodiment of the invention.
Figure 37:
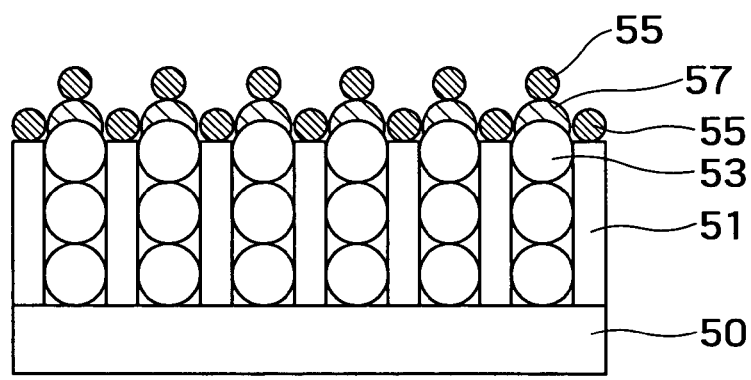
FIG. 37 shows a process subsequent to FIG. 36.
Figure 38:
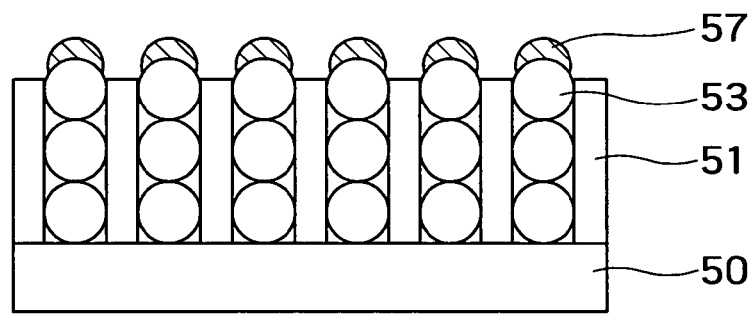
FIG. 38 shows a process subsequent to FIG. 37.

FIGS. 36 to 38 are sectional views showing manufacturing processes of a field emitter according to the eighth embodiment of the invention in the order of the processes. The embodiment can form the same field emitter as the third embodiment. First, by executing the processes shown in FIGS. 15 and 16, the polystyrene derivatives 55 are formed on the tip ends of the carbon nanotubes 51, and the electrode material 57 is deposited thereon. Simultaneously, projections and depressions are formed on the surface of the electrode material 57 because of the difference between the height of the topmost portions of the polystyrene derivatives 53 and the height of the topmost portions of the polystyrene derivatives 55.

Referring to FIG. 36, then, the polystyrene derivatives 55 having OH groups are dispersed in a solvent and this solution is applied onto the surface of the electrode material 57 by the spin casting method. By volatizing the solvent, the polystyrene derivatives 55 are arranged in the depressions on the surface of the electrode material 57.

Referring to FIG. 37, then, the electrode material 57 is etched by RIE using the polystyrene derivatives 55 on the electrode material 57 as a mask.

Referring to FIG. 38, the polystyrene derivatives 55 on the electrode material 57 and the polystyrene derivatives 55 on the carbon nanotubes 51 are dissolved with a tetra-methyl-ammonium alkaline solution. Thereby, the electrode material 57 can be formed on the peripheries of the tip ends of the carbon nanotubes 51. This can be used as a field emitter as shown in FIG. 17.

Unlike the third embodiment, the embodiment can form the field emitter without lifting off the electrode material 57.

(Ninth Embodiment)

Figure 39:
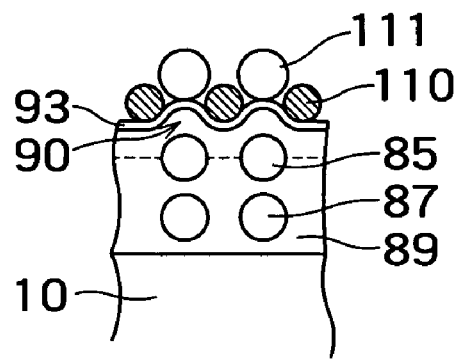
FIG. 39 is a sectional view showing a manufacturing process of an electrode of a quantum bit according to a ninth embodiment of the invention.
Figure 40:
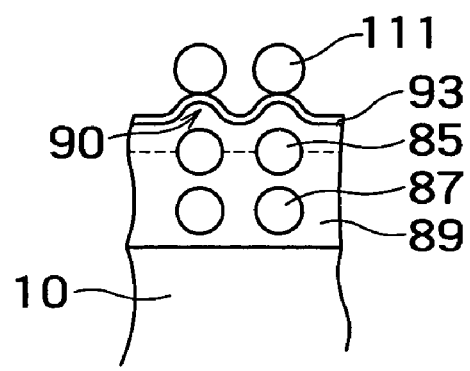
FIG. 40 shows a process subsequent to FIG. 39.

FIGS. 39 and 40 are sectional views showing manufacturing processes of an electrode of a quantum bit according to the ninth embodiment of the invention in the order of the processes. The embodiment can form a gate electrode on the same quantum bit as in the fifth embodiment. First, by executing the processes shown in FIGS. 25 and 26, a silicon oxide film 89 is etched, and the upper parts of quantum dots 85 are exposed. Then, the exposed parts of the quantum dots 85 are oxidized. Alternatively, a silicon oxide film is deposited on the quantum dots 85 by the CVD method or the like. Thereby, protruding portions 90 consisting of the silicon oxide film are formed on the quantum dots 85.

Referring to FIG. 39, then, an electrode material 93 is deposited on the silicon oxide film 89. Then, the polystyrene derivatives 110 having OH groups are dispersed in a solvent and this solution is applied onto the surface of the electrode material 93 by the spin casting method. By volatizing the solvent, the polystyrene derivatives 110 are arranged in the depressions between the adjacent protruding portions 90. The size of the polystyrene derivative 110 is adjusted so that the topmost portion of the polystyrene derivative 110 is higher than the topmost portion of the protruding portion 90. The size of the polystyrene derivative 110 may be changed in the same manner as in the first embodiment. The polystyrene derivative 110 is poly p-hydroxy styrene, for example.

Next, polystyrene derivatives 111 having no OH group are dispersed in a solvent and this solution is applied onto the surface of the electrode material 93 by the spin casting method. By volatizing the solvent, the polystyrene derivatives 111 are arranged in the depressions between the adjacent polystyrene derivatives 110. That is, the polystyrene derivatives 111 are arranged on the protruding portions 90. The polystyrene derivative 111 consists of poly p-acetoxy styrene, for example.

Referring to FIG. 40, then, the polystyrene derivatives 110 are dissolved with a tetra-methyl-ammonium alkaline solution. Thereby, the polystyrene derivatives 110 can be eliminated while polystyrene derivatives 110 are allowed to remain on the protruding portions 90.

Further, the electrode material 93 is etched using RIE or the like with the polystyrene derivatives 111 as a mask. As a result, a shown in FIG. 29, the electrode material 93 is formed on the quantum dots 85 and 87 as gate electrodes.

Unlike the fifth embodiment, the embodiment can form the gate electrodes on the quantum dots 85 and 87 without lifting off the electrode material 93.

(Tenth Embodiment)

According to this embodiment, an electrode in which current is injected in a quantum dot laser can be manufactured according to any one of the first to ninth embodiments. The quantum dot laser includes a quantum dot array having quantum dots arranged lengthwise and breadthwise in an active layer thereof as a layer structure.

In a conventional quantum dot laser, since the electrodes can not be formed only on the independent quantum dots, current is allowed to flow in the entire layer including the quantum dot array for oscillation of a laser.

However, according to the embodiment, since the electrodes can be formed only on the independent quantum dots, current can be allowed to flow in the part of the quantum dots only. Therefore, the quantum dot laser manufactured according to the embodiment can generate a laser more effectively than the conventional quantum dot laser.

For example, a quantum dot laser disclosed in Koichi Tachibana et al., Appl. Phys. Lett., Vol. 75, p2605 (1999) has plural layers of quantum dots consisting of $In_{0.2}Ga_{0.8}N$. According to the embodiment, electrode wiring can be provided on the quantum dots of the uppermost layer of these layers. Thereby, current can be allowed to flow in the part of the quantum dots only. The quantum dot of the quantum dot laser consists of $In_{0.2}Ga_{0.8}N$, however, the embodiment can be applied to a quantum dot laser having a quantum dot consisting of a material such as InAs or GaAs.

(Eleventh Embodiment)

According to this embodiment, an auxiliary electrode can be manufactured according to any one of the first to ninth embodiments in a quantum cellular automaton. The quantum cellular automaton is disclosed in Craig S. Lent et al., Quantum Cellular Automata,: Nanotechnology, Vol. 4, p49 (1993). The logic circuit of the quantum cellular automaton does not require wiring originally. However, actually, various auxiliary electrodes are required within the logic circuit for the reason that quantum dots are not necessarily manufactured uniformly, or the like. Since the mutual positional relationships between the quantum dots are important in the quantum cellular automaton, the auxiliary electrodes are required to be formed in accurate positions.

According to the embodiment, the auxiliary electrodes can be formed in accurate positions according to the mutual positional relationships between the quantum dots in the quantum cellular automaton. For example, electrodes can be formed in the structure referred to as a terminal or cell in which several quantum dots are formed closely each other.

(Twelfth Embodiment)

According to this embodiment, word lines and bit lines of an MRAM (Magnetic random access memory), a DRAM (Dynamic random access memory), and the like can be manufactured according to any one of the first to ninth embodiments. These memories are also miniaturized, and accordingly, word lines and bit lines equal to or less than several tens of nanometers are required. According to this embodiment, wiring such as word lines and bit lines can be formed to such minute memory in a self-alignment manner.

In the above described embodiments, as the electrode material, in place of Al, a metal such as Ti, Co, Fe, Ni, and Cu, an alloy thereof, or silicide may be used.

Further, in the above described embodiments, a polystyrene derivative is used as a fine particle introduced between the protruding portions, however, an olefin polymer macromolecule other than the polystyrene derivative may be used. Further, not only a homopolymer, but also a copolymerized polymer may be used.

The electrode manufacturing method according to the above described embodiments enables formation of electrodes in a nano-level structure such as a carbon nanotube or quantum dot in a self-alignment manner.

Note that the invention is not limited to the above described embodiments themselves, component elements can be modified and embodied within a range not desorbing the content thereof in the practical phase. Further, various inventions can be formed by suitable combination of plural component elements disclosed in the above described embodiments. For example, some component elements may be deleted from all of the component elements shown in the embodiments. Furthermore, component elements adopted to different embodiments may be suitably combined.

Other embodiments of the present invention will be apparent to those skilled in the art from consideration of the specification and practice of the invention disclosed herein. It is intended that the specification and example embodiments will be considered as exemplary only, with a true scope and spirit of the invention being indicated by the following.

What is claimed is:

1. An electrode manufacturing method comprising:
   forming plural protruding portions on a surface of a substrate;
   introducing first particles having a size that can be changed according to heat, light, or a first solvent between said plural protruding portions;
   changing the size of the first particles by applying heat, light, or the first solvent to said first particles; and
   depositing an electrode material onto the surface of said substrate.

2. The electrode manufacturing method according to claim 1, further comprising: after depositing said electrode material, eliminating the electrode material on said first particles by eliminating said first particles while allowing the electrode material on said protruding portions to remain as electrodes.

3. The electrode manufacturing method according to claim 1, wherein, when the protruding portions are formed, said plural protruding portions are formed in a matrix form, and distances of said protruding portions arranged along a row direction are longer than distances of said protruding portions arranged along a column direction,
   wherein, when the size of the first particles are changed, the size of said first particles is changed for making said first particles adjacent along said column direction into contact with each other, and making said first particles adjacent along said row direction spaced from each other,
   the method further comprising, after said size changing: depositing a mask material onto the surface of said substrate; and
   introducing second particles having a size smaller than that of the first particles after making the size of said first particles smaller, or eliminating said first particles,
   the method further comprising: after depositing the electrode material, remaining the electrode material on said protruding portions adjacent along said row direction and the electrode material between said protruding portions adjacent along said row direction as a electrodes by eliminating said mask material between said first or second particles adjacent along said row direction and said first or second particles together with said electrode material thereon.

4. The electrode manufacturing method according to claim 1, wherein, when the protruding portions are formed, said plural protruding portions are formed in a matrix form, and distances of said protruding portions arranged along a row direction are longer than distances of said protruding portions arranged along a column direction,
   wherein, when the size of the first particle is changed, the size of said first particles is changed for making said first particles adjacent along said column direction into contact with each other, and making said first particles adjacent along said row direction spaced from each other,
   the method further comprising, after said size changing: providing second particles different from said first particles on said plural protruding portions between said adjacent first particles; and
   making said first particles adjacent along said column direction spaced by making said first particles smaller,
   wherein, when the electrode material is deposited, the electrode material is deposited on said first particles and said second particles,
   the method further comprising: after depositing said electrode material, eliminating said first particles and said second particles, and remaining said electrode material between said first particles adjacent along said column direction.

5. The electrode manufacturing method according to claim 1, wherein, when the first particles are introduced or when said size of the first particles are changed, upper ends of said first particles are treated so as to be higher than said plural protruding portions with the surface of said substrate as reference,
   the method further comprising, after changing the size, providing second particles different from said first particles on said plural protruding portions between said adjacent first particles,
   wherein, when said electrode material is deposited, the electrode material is deposited on said first particles and said second particles,
   the method further comprising: after depositing said electrode material: arranging third particles having a size that changes according to heat, light, or a second solvent between said adjacent second particles;
   eliminating the electrode material on said second particles with said third particles as a mask; and
   eliminating said second and third particles and remaining the electrode material on said first particles as electrodes.

6. The electrode manufacturing method according to claim 1, wherein said first particle or said second particle consists of a polystyrene derivative, and said first solvent or said second solvent is a solution including a material expressed by the following formula 1 or an alkaline solution:

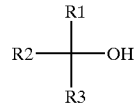
[Formula 1]

(R1, R2, and R3 are hydrogen or organic groups).

7. The electrode manufacturing method according to claim 3, wherein said first particle or said second particle consists of a polystyrene derivative, and said first solvent or said second solvent is a solution including a material expressed by the following formula 1 or an alkaline solution:

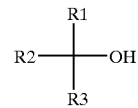
[Formula 1]

(R1, R2, and R3 are hydrogen or organic groups).

8. The electrode manufacturing method according to claim 1, wherein said first particle and said second particle are polymeric material spheres having uniform sizes.

9. The electrode manufacturing method according to claim 3, wherein said first particle and said second particle are polymeric material spheres having uniform sizes.

10. The electrode manufacturing method according to claim 4, wherein said first particle and said second particle are polymeric material spheres having uniform sizes.

11. The electrode manufacturing method according to claim 5, wherein said first particle or said second particle is a material in which a part of hydrogen of phenyl groups of polystyrene is substituted by organic groups via an ester linkage or ether linkage, or polystyrene.

* * * * *